(12) United States Patent
Zierhofer (10) Patent No.: US 6,661,363 B2
(45) Date of Patent: Dec. 9, 2003

(54) SYSTEM AND METHOD FOR ADAPTIVE SIGMA-DELTA MODULATION

(75) Inventor: Clemens M. Zierhofer, Kundl (AT)

(73) Assignee: MED-EL Elektromedizinische Geraete Ges.m.b.H., Innsbruck (AT)

( * ) Notice: Subject to any disclaimer, the term of this patent is extended or adjusted under 35 U.S.C. 154(b) by 0 days.

(21) Appl. No.: 10/109,537

(22) Filed: Mar. 28, 2002

(65) Prior Publication Data

US 2003/0184463 A1 Oct. 2, 2003

(51) Int. Cl.$^7$ ............................................... H03M 3/00
(52) U.S. Cl. ......................... 341/143; 341/144; 341/155
(58) Field of Search ................................. 341/143, 144

(56) References Cited

U.S. PATENT DOCUMENTS

| | | | | |
|---|---|---|---|---|
| 3,918,042 A | * | 11/1975 | Werner ........................ | 341/143 |
| 4,233,684 A | * | 11/1980 | Eggermont ................. | 375/249 |
| 4,612,654 A | * | 9/1986 | DeFreitas .................... | 341/143 |
| 4,633,196 A | * | 12/1986 | Peled et al. ................. | 341/143 |
| 4,700,362 A | * | 10/1987 | Todd et al. .................. | 341/143 |
| 4,829,299 A | * | 5/1989 | Mandell ...................... | 341/143 |
| 4,937,577 A | | 6/1990 | Rich et al. .................. | 341/143 |
| 4,940,977 A | * | 7/1990 | Mandell ...................... | 341/143 |
| 5,012,245 A | | 4/1991 | Scott et al. ................. | 341/150 |
| 5,027,306 A | | 6/1991 | Dattorro et al. ............ | 364/724 |
| 5,323,157 A | | 6/1994 | Ledzius et al. ............. | 341/143 |
| 5,357,252 A | | 10/1994 | Ledzius et al. ............. | 341/143 |
| 5,408,235 A | | 4/1995 | Doyle et al. ................ | 341/143 |
| 5,549,658 A | | 8/1996 | Shannon et al. ............ | 607/57 |
| 5,601,617 A | | 2/1997 | Loeb et al. .................. | 607/56 |
| 5,626,629 A | | 5/1997 | Faltys et al. ................ | 607/57 |
| 6,501,329 B1 | * | 12/2002 | Petrofsky et al. ........... | 327/552 |

FOREIGN PATENT DOCUMENTS

WO    WO 02/09292 A2    1/2002    ............ H03M/3/02

OTHER PUBLICATIONS

Clemens M. Zierhofer, Member IEEE, Adaptive Sigma Delta Modulation with One–bit Quantization, May 2000, IEEE, vol. 47, No. 5, Page 408–415.*

Sakane et al., "Two–bit instantaneously adaptive delta modulation for PCM encoding", Database Inspec 'Online! Institute of Electrical Engineers, Stevenage, GB; Database accession No. 1220789 XP002224775, abstract. The whole document: Radio and Electronic Engineer, Apr. 1978, UK, vol. 48, No. 4, pp. 189–197, ISSN: 0033–7722.

International Search Report.

Zierhofer, C., Adaptive Sigma–Delta Modulation with One–Bit Quantization, Member, IEEE.

(List continued on next page.)

*Primary Examiner*—Michael Tokar
*Assistant Examiner*—Lam T. Mai
(74) *Attorney, Agent, or Firm*—Bromberg & Sunstein LLP (57) ABSTRACT

A method and system for an adaptive sigma-delta (Σ-Δ) modulator with one bit quantization that improves the signal-to-noise (SNR) of a Σ-Δ modulator is presented. A difference signal is produced representing the difference between an analog input signal x(n) and a first adaptive feedback signal z(n), the amplitude of the analog input x(n) within a first range [−a, +a]. The difference signal is accumulated to produce a first accumulated signal representing an accumulation of the difference signal. The first accumulated signal is then quantized, creating a first quantized digital signal $y_0(n)$. Based on the first quantized digital signal $y_0(n)$ a first digital output signal $z_0(n)$ is produced, such that the instantaneous magnitude of the first analog feedback signal z(n) is substantially kept within the first range [−a, +a] and greater than the analog input signal's x(n) instantaneous magnitude. A digital-to-analog conversion is performed on the first digital output signal $z_0(n)$ to produce the first adaptive feedback signal z(n).

28 Claims, 10 Drawing Sheets

OTHER PUBLICATIONS

Chakravarthy, C.V., An Amplitude–Controlled Adaptive Delta Sigma Modulator, The Radio and Electronic Engineer, vol. 49, No. 1.

Jaggi, M.P. & Chakravarthy, C.V., Instantaneously Adaptive Delta Sigma Modulator Modulateur Delta Sigma Instantanement Adaptatif.

* cited by examiner

SYSTEM AND METHOD FOR ADAPTIVE SIGMA-DELTA MODULATION

TECHNICAL FIELD AND BACKGROUND ART

The invention generally relates to signal processing, and more particularly, to analog to digital conversion using sigma-delta modulation. Sigma-delta (Σ-Δ) modulation is a widely used and thoroughly investigated technique for converting an analog signal into a high-frequency digital sequence. See, for example, "Oversampling Delta-Sigma Data Converters," eds. J. C. Candy and G. C. Temes, IEEE Press, 1992, (hereinafter Candy) and "Delta-Sigma Data Converters," eds. S. R. Northworthy, R. Schreier, G. C. Temes, IEEE Press, 1997, both of which are hereby incorporated herein by reference.

In Σ-Δ modulation, a low-resolution quantizer is incorporated within a feedback loop configuration in which the sampling frequency is much higher than the Nyquist frequency of the input signal (i.e., much higher than twice the maximum input frequency). In addition, the noise energy introduced in the quantizer is shaped towards higher frequencies according to a so called "noise-transfer-function" NTF(z), and the signal passes the modulator more or less unchanged according to a so called "signal-transfer-function" STF(z).

Figure 1A:
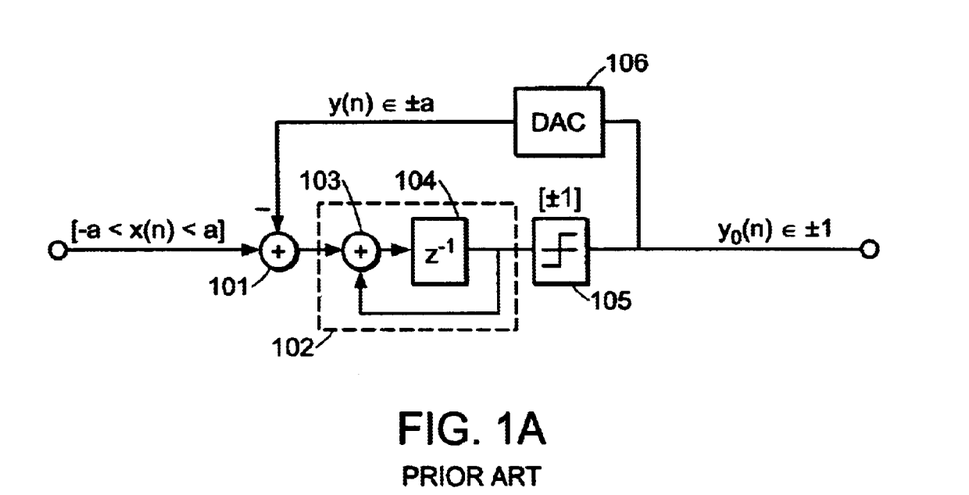
FIG. 1(a) is a block diagram of a prior art first order $\Sigma$-$\Delta$ modulator for a discrete time system.

FIG. 1(a) depicts a simple first order Σ-Δ modulator for a discrete time system having a subtraction stage 101, an accumulator 102 (including an integrator adder 103 and a delay line 104), a one-bit quantizer 105, and a 1-bit digital-to-analog converter (DAC) 106. In normal operation, an input signal x(n) within the range [−a, +a] is converted to the binary output sequence $y_0(n) \in \pm 1$. Quantizer 105 produces a+1 for a positive input and a−1 for a negative input. The output from quantizer 105 is fed back through DAC 106 and subtracted from input signal x(n) by subtraction stage 101. Thus, the output of subtraction stage 101 represents the difference between input signal x(n) and the quantized output signal $y_0(n)$. As can be seen from FIG. 1(a), the output of accumulator 102 represents the sum of its previous input and its previous output. Thus, depending on whether the output of the accumulator 102 is positive or negative, the one-bit quantizer 105 outputs a+1 or a−1 as appropriate. Herein, and in the appended claims, analog (physical) and digital representations of signals are distinguished from each other by labeling digital one or multi-bit signals with the subscript "0".

Figure 1B:
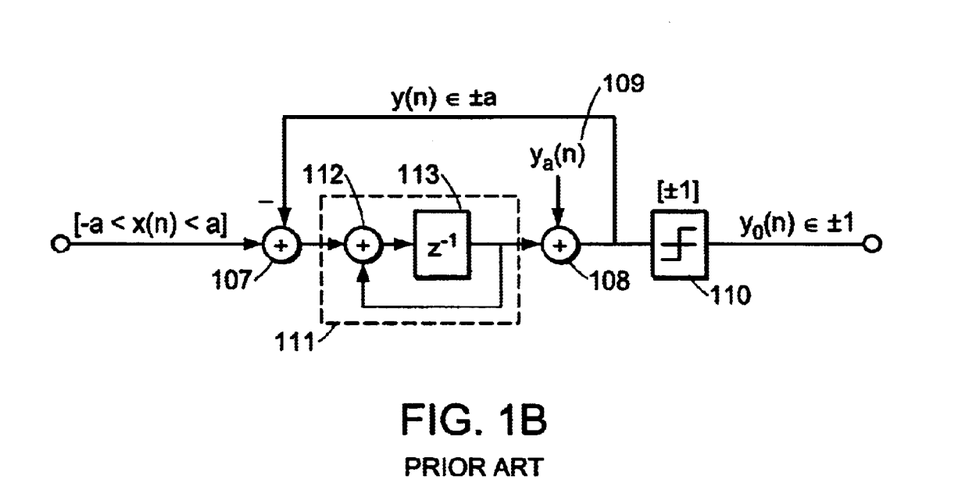
FIG. 1(b) is a block diagram of a prior art first order $\Sigma$-$\Delta$ modulator for a linear model, where the quantizer is replaced by an adder and a noise source.

In FIG. 1(b), a linear model of FIG. 1(a) is shown, and similarly includes a subtraction stage 107, and an accumulator 111 (including an integrator adder 112 and a delay line 113). Quantizer 105 is replaced by an adder 108 and a noise source 109. To convert signal y(n) to $y_0(n)$, a comparator 110 for detection of the sign of y(n) is included. The basic relationship between the z-transforms of system input x(n), quantizer noise $\gamma_a(n)$, and the two-level output sequence y(n) is:

$$Y(z) = z^{-1} X(z) + (1 - z^{-1}) \Gamma_a(z) \qquad (1)$$

The signal transfer function and noise-transfer function can be identified as $STF(z) = z^{-1}$ and $NTF(z) = (1 - z^{-1})$, respectively.

Quality of digital representation can be described by the signal-to-noise ratio $$SNR = 10 \log_{10} \frac{S}{N},$$

where S is the signal power and N is the noise power within a given bandwidth B. Regarding equation (1), the noise power N depends on both the noise transfer function NTF(z) and the overall amount of noise $\Gamma_a(z)$ added in the quantization stage. To improve the SNR, two approaches can be pursued:

(a) for a given overall noise power $\Gamma_a(z)$, i.e., for given quantizer levels ±a, modify the NTF(z) to remove more noise power from the base band by improved noise shaping, and (b) for a given NTF(z), try to reduce the overall noise power introduced to the system.

Approach (a) can be achieved, for example, by increasing the order of the sigma-delta modulator, as described by Candy. For higher order modulators, the noise transfer function becomes $NTF(z) = (1 - z^{-1})^k$, which means an enhanced noise-shaping effect. For examples of approach (b) see Zierhofer C. M., "Adaptive sigma-delta modulation with one-bit quantization," IEEE trans. CAS II, vol. 47, No. 5, May 2000 (hereinafter Zierhofer), and U.S. patent application for Adaptive Sigma-delta Modulation with One-bit Quantization, Ser. No.: 09/496,756, filed Feb. 3, 2000 (hereinafter U.S. patent application Ser. No.: 09/496,756), both of which are incorporated herein by reference, where a sigma-delta modulator is employed within a feedback loop configuration. It is shown that the input signal of this modulator applies within a reduced range, and thus the two levels of the quantizer can be reduced. As a consequence, less noise power is introduced to the system, and the SNR is improved.

SUMMARY OF THE INVENTION

In accordance with one embodiment of the invention, a method and system for an adaptive sigma-delta (Σ-Δ) modulator with one bit quantization that improves the signal-to-noise (SNR) of a Σ-Δ modulator is presented. A difference signal is produced representing the difference between an analog input signal x(n) and a first adaptive feedback signal z(n), the amplitude of the analog input x(n) within a first range [−a, +a]. The difference signal is accumulated to produce a first accumulated signal representing an accumulation of the difference signal. The first accumulated signal is then quantized, creating a first quantized digital signal $y_0(n)$. Based on the first quantized digital signal $y_0(n)$ a first digital output signal $z_0(n)$ is produced, such that the instantaneous magnitude of the first analog feedback signal z(n) is substantially kept within the first range [−a, +a] and greater than the analog input signal's x(n) instantaneous magnitude. A digital-to-analog conversion is performed on the first digital output signal $z_0(n)$ to produce the first adaptive feedback signal z(n).

In related embodiments of the invention, the first quantized digital signal $y_0(n)$ produced includes a two-level digital output sequence. The two-level digital output may include values of +1 and −1. Producing the first digital output signal $z_0(n)$ may include multiplying the first quantized digital signal $y_0(n)$ by a step size $c_0(n)$. The step size $c_0(n)$ may be based on a set Y of code words, where $Y = \{y_0(n), y_0(n-1), y_0(n-2) \ldots y_0(n-n_x)\}$, $n_x$ being a predetermined integer. Determining the step size $c_0(n)$ may include increasing the step size $c_0(n)$ if a majority of the code words are equal, or decreasing the step size $c_0(n)$ if the code words alternate. The step size $c_0(n)$ may be non-linear. Multiplying the first quantized digital signal $y_0(n)$ by a step size $c_0(n)$ may include using a look-up-table RAM.

Other related embodiments of the invention may further comprise high pass filtering the analog input signal $x(n)$. In one embodiment of the invention, high pass filtering may include subtracting from the analog input signal $x(n)$ a feedback signal based on the digital output signal $z_0(n)$. In another embodiment of the invention, high pass filtering may include producing a second accumulated signal $az_0(n)$ representing the accumulation of the first digital output signal $z_0(n)$. The second accumulated signal $az_0(n)$ is multiplied by a factor $\theta$ to produce a multiplied signal $w_0(n)$. The analog input signal $x(n)$ is then produced by subtracting from an analog pre-input signal $x_p(n)$ the second analog feedback signal $w(n)$. In yet another embodiment of the invention, high pass filtering the analog input signal $x(n)$ may include producing a second accumulated signal $az_0(n)$ representing the accumulation of the first digital output signal $z_0(n)$. A digital signal $w_0(n)$ is produced using an embedded numeric multibit sigma-delta modulator, the digital signal $w_0(n)$ representing the accumulated signal $az_0(n)$ multiplied by a factor $\theta$ such that the digital signal $w_0(n)$ includes low frequency components of the analog input signal $x(n)$. The digital signal $w_0(n)$ is then added to the first digital output signal $z_0(n)$. In producing digital signal $w_0(n)$, the digital signal $w_0(n)$ may be represented by a smaller number of bits as compared to the accumulated signal $az_0(n)$, with information contained in the bit difference being retained in the temporal fine structure of $w_0(n)$.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

Figure 2:
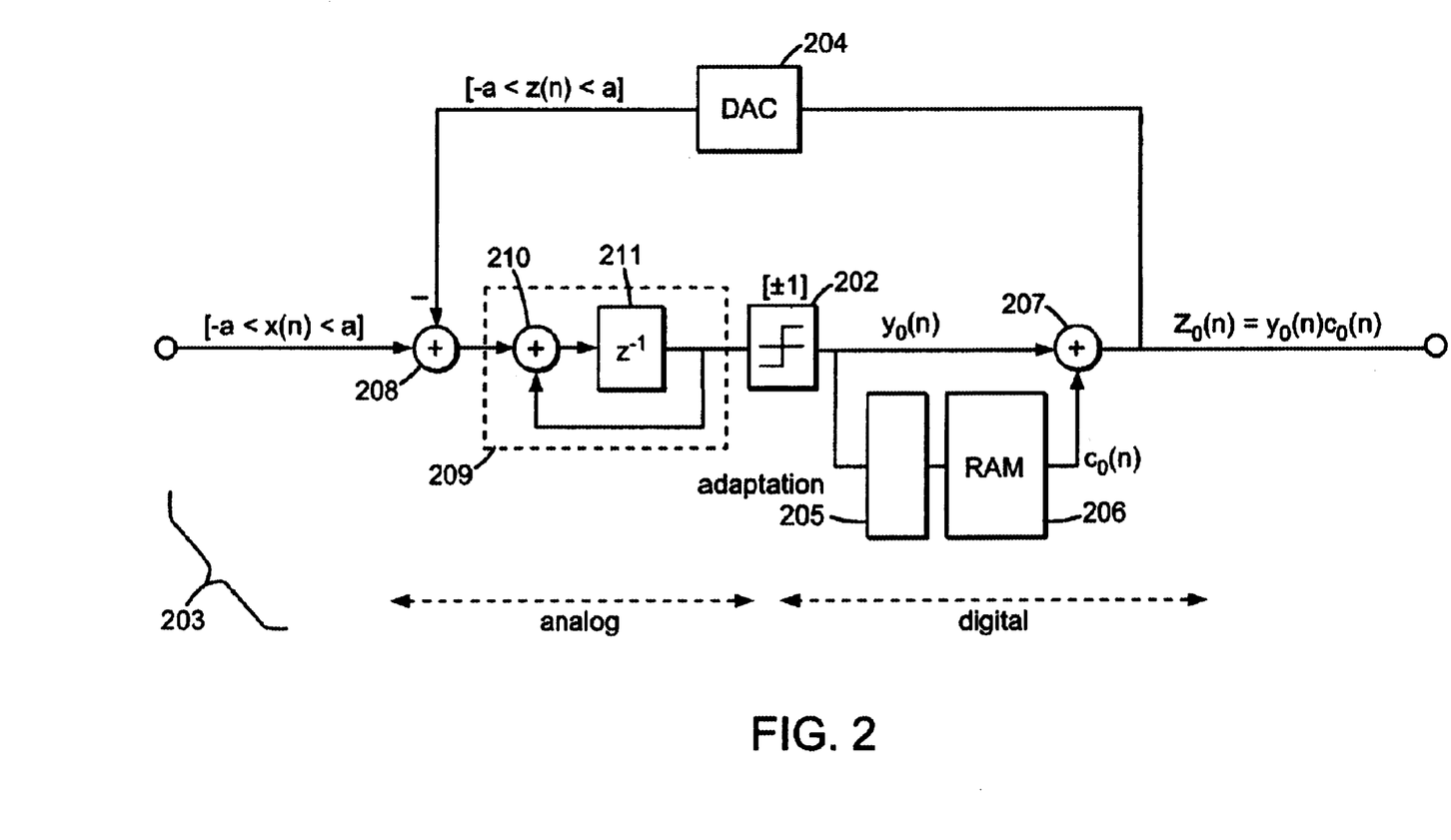
FIG. 2 is a block diagram of an adaptive sigma-delta ($\Sigma$-$\Delta$) modulator with one bit quantization that improves the signal-to-noise (SNR) of a $\Sigma$-$\Delta$ modulator in accordance with one embodiment of the invention.

A method and system for an adaptive sigma-delta ($\Sigma$-$\Delta$) modulator with one bit quantization that improves the signal-to-noise (SNR) of a $\Sigma$-$\Delta$ modulator is presented. A block diagram of the system in accordance with one embodiment of the invention is shown in FIG. 2. The output $y_0(n)$ and two level feedback signal $y(n) \epsilon \pm a$ of a standard $\Sigma$-$\Delta$ modulator of $1^{st}$ order is replaced by a multilevel output signal $z_0(n)$ and feedback signal $z(n)$, respectively. The instantaneous magnitude of the multilevel feedback signal $z(n)$ is kept within the range $[-a < z(n) < a]$ and greater than the instantaneous magnitude of the input signal $x(n)$ by an adaptation stage 205. Compared to the non-adaptive modulator, the noise source 107 in FIG. 1(b) is thus reduced, and the SNR is considerably enhanced. The adaptation algorithm of the adaptive $\Sigma$-$\Delta$ presented can be fully exploited, if the input $x(n)$ is a zero-mean signal, or if the dc-component of $x(n)$ is at least close to zero. If $x(n)$ contains a considerable dc-component, the input dynamic range is reduced. Accordingly, an implementation of a high-pass filter stage is also presented.

FIG. 2 can be separated into an analog and a digital section. An analog input $x(n)$ having range $[-a, +a]$, is inputted into a subtraction stage 208. The analog output of the subtraction stage is then inputted into an accumulator 209 (including an integrator adder 210 and a delay line 211) and then quantized 202. The digital output of the quantizer 202, which may be, but is not limited to, $y_0(n) \epsilon \pm 1$, is multiplied 207 by a step size sequence $c_0(n)$ to create output signal $z_0(n)$. Output signal $z_0(n)$ is passed through a digital-to-analog converter (DAC) 204 to create the analog feedback signal $z(n)$.

Step size sequence $c_0(n)$ is generated in an adaptation stage 205. The step size $c_0(n)$ at a particular instant is controlled by a set of code words $[y_0(n), y_0(n-1), y_0(n-2), \ldots]$ which represent the instantaneous value of $y_0(n)$, and a particular (finite) number of previous code words $y_0(n-1), y_0(n-2) \ldots$ The primary intention of adaptation stage 205 is to keep the instantaneous magnitude of $z(n)$ greater than the instantaneous magnitude of input signal $x(n)$, $$|z(n)| > |x(n)|. \tag{2}$$

The way the adaptation stage works is intuitively clear. Step size $c_0(n)$ needs to be increased, if the set $[y_0(n), y_0(n-1), y_0(n-2), \ldots]$ contains many equal code words. In this case, $|x(n)|$ tends to exceed $|z(n)|$, which violates condition (2). On the other hand, $c_0(n)$ needs to be decreased, if the set $[y_0(n), y_0(n-1), y_0(n-2), \ldots]$ shows an alternating pattern of code words.

Using, for example, a 9-bit DAC 204 for the system shown in FIG. 2, the input range $[-a, +a]$ is subdivided into 511 equally spaced discrete signal levels. Thus, the digital signals $z_0(n)$ and $c_0(n)$ are composed of 9 bits, and 8 bits, respectively. In accordance with one embodiment of the invention, an adaptation algorithm for a system of 1st order, with constant $\alpha$ chosen to be $$\alpha = \frac{16}{15},$$

is provided in Tab. 1.

As shown in Tab. 1, the step size is increased by approximately a factor $\alpha^3$, if five consecutive code words are equal, and decreased by about a factor

TABLE 1

| Code | Step Size Multiplier |
| --- | --- |
| $y_0(n) = y_0(n-1) = y_0(n-2) = y_0(n-3) = y_0(n-4)$ | $c_0(n) = \text{round}(\alpha^3 c_0(n-1))$ |
| $y_0(n) = -y_0(n-1) = y_0(n-2) = -y_0(n-3)$ | $c_0(n) = \text{round}(\alpha^{-1} c_0(n-1))$ |
| Other combinations | $c_0(n) = c_0(n-1)$ |

$\alpha^{-1}$, if four consecutive code words have alternating signs. Since step sizes $c_0(n)$ have a limited resolution of 8-bits, the products $\alpha^3 c_0(n-1)$ and $\alpha^{-1} c_0(n-1)$ cannot be implemented exactly, but have to be rounded to the next integer. For small step sizes, the deviations due to rounding are considerable, but this type of imperfection is not essential for the system performance. While a multiplier can be used to calculate $c_0(n)$, in various embodiments of the invention, a look-up-table RAM 206 is utilized instead, where all possible step sizes $c_0(n)$ are stored as 8-bit integers, for example. The minimum and maximum step sizes are then $c_{0,min}=1$ and $c_{0,max}=255$, respectively. The computation of product $\alpha^3 c_0(n)$ may be achieved by simply increasing the instantaneous RAM-address index by 3. Similarly, for product $\alpha^{-1} c_0(n)$, the instantaneous address index is decreased by 1.

Figure 3A:
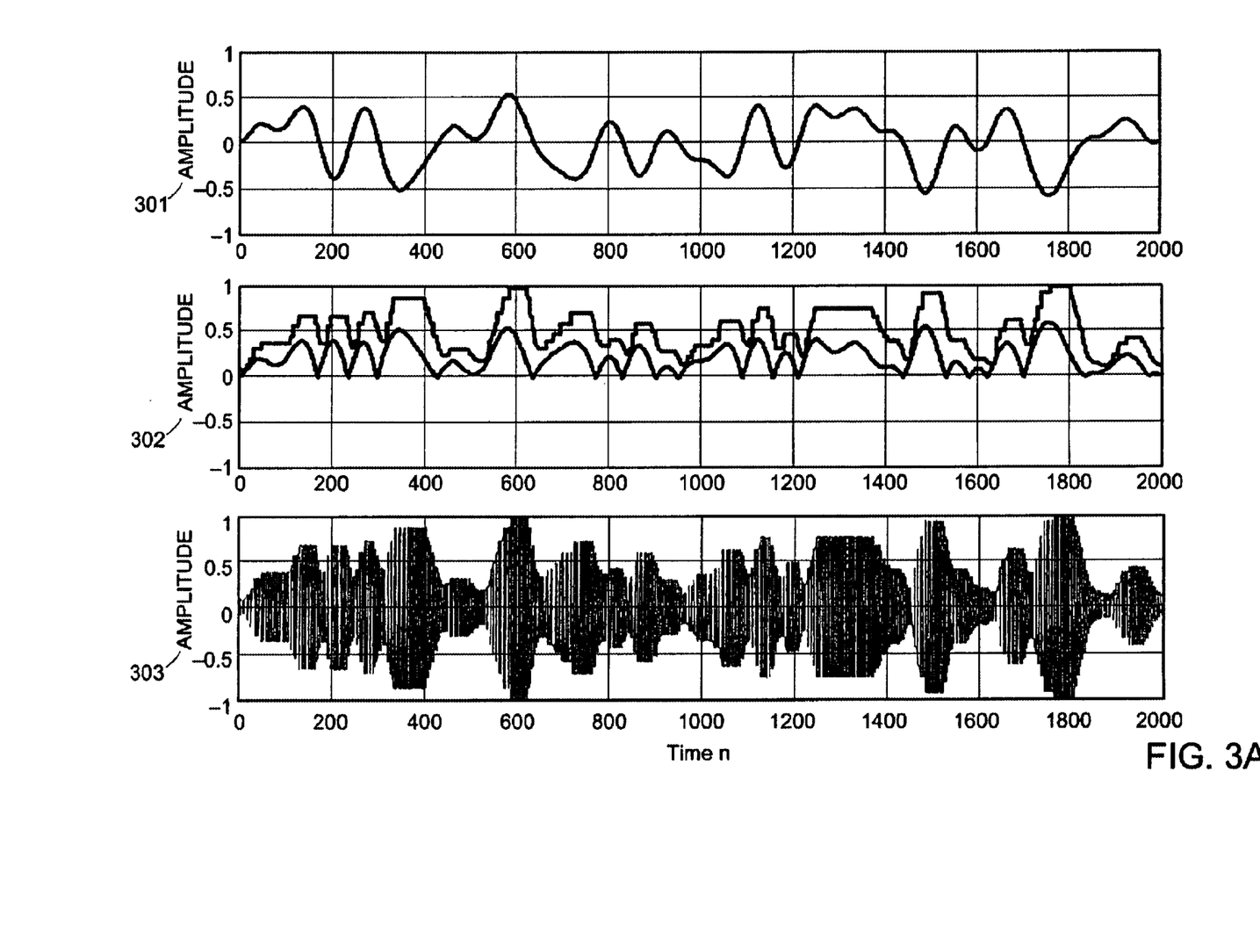
FIG. 3(a) shows representative waveforms for an adaptive sigma-delta ($\Sigma$-$\Delta$) modulator in accordance with one embodiment of the invention.
Figure 3B:
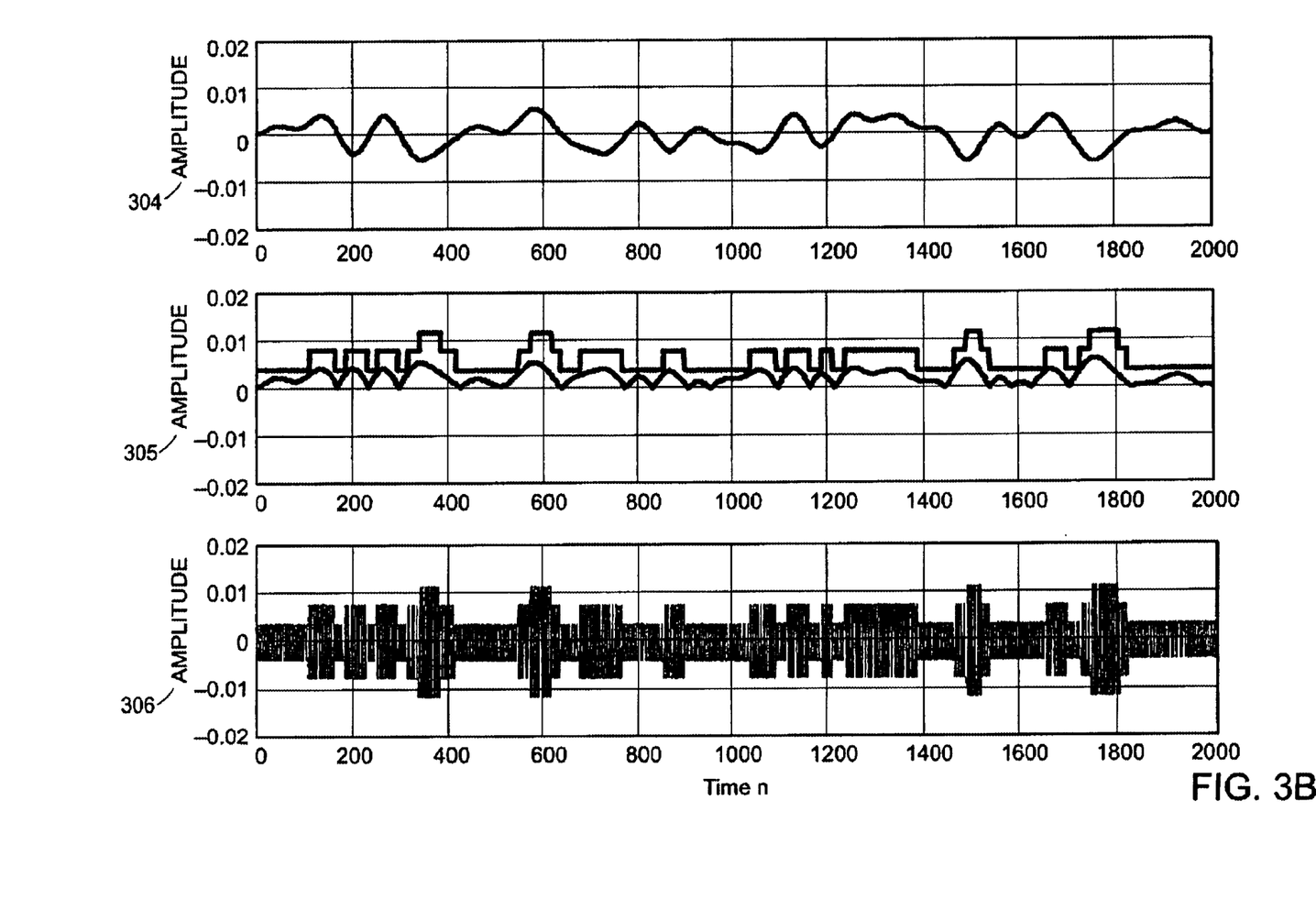
FIG. 3(b) shows representative waveforms for an adaptive sigma-delta ($\Sigma$-$\Delta$) modulator in accordance with one embodiment of the invention.

Sample waveforms for an adaptive $\Sigma$-$\Delta$ modulator implementing the adaptation algorithm described in Tab. 1 are shown in FIGS. 3(a) and 3(b). The first trace 301 in FIG. 3(a) depicts an example of an input signal x(n). The second trace 302 in FIG. 3(a) shows the full wave rectified version |x(n)| together with the magnitude |z(n)| of the DAC-output signal. Condition (2) is fulfilled for almost all samples, but a close examination shows that there is a violation at instant n=1643. This remains singular, however, and has negligible impact on the overall performance of the system. The third trace 303 in FIG. 3(a) illustrates the full DAC-output signal z(n). In FIG. 3(b), the system behavior is shown, if signal x(n) is attenuated by 40 dB, i.e. for x(n)/100. Traces 304, 305, and 306 represent an input signal x(n), the full wave rectified version |x(n)| together with the magnitude |z(n)| of the DAC-output signal, and the full DAC-output signal z(n), respectively. As expected, the quantization of signals |z(n)| and z(n) appears more pronounced, and the digital sequence $c_0(n)$ varies between 1 and 3.

The examples FIGS. 3(a) and 3(b) also demonstrate that the step-size adaptation algorithm works instantaneously, that is, step size multiplier c(n) tracks the individual maxima and minima of input x(n). Signal c(n) can directly be used to estimate the instantaneous power of the input signal, which is advantageous, for example, in signal processing applications for automatic gain control (AGC) for speech signals. Adaptive $\Sigma$-$\Delta$ modulation schemes typically use comparatively slow adaptation algorithms, where time constants in the range of tens of milliseconds are involved (usually referred to as "syllabic compression"). An example is Chakravarthy, C. V., "An amplitude-controlled adaptive delta sigma modulator," Radio & Electronic Engineer (London), vol. 49, pp. 49–54, January 1979, which is hereby incorporated by reference. Systems like this cause gross errors in case of sudden increase of the amplitudes of the input signals and are not practical in signal processing applications, where a permanent accurate representation of the input signal is of importance. Additionally, the use of non-linear step sizes makes the adaptive algorithm more responsive to changes in input amplitudes compared to prior art adaptive algorithms with a constant step size, such as described in Jaggi, M. P., "Instantaneously Adaptive Delta Sigma Modulator" Can. Elect. Eng. 1, Vol. 11 No. 1, 1986, which is herein incorporated by reference. This is important, for example, in keeping the instantaneous magnitude of the first analog feedback signal greater than the input signal's instantaneous magnitude.

Figure 4:
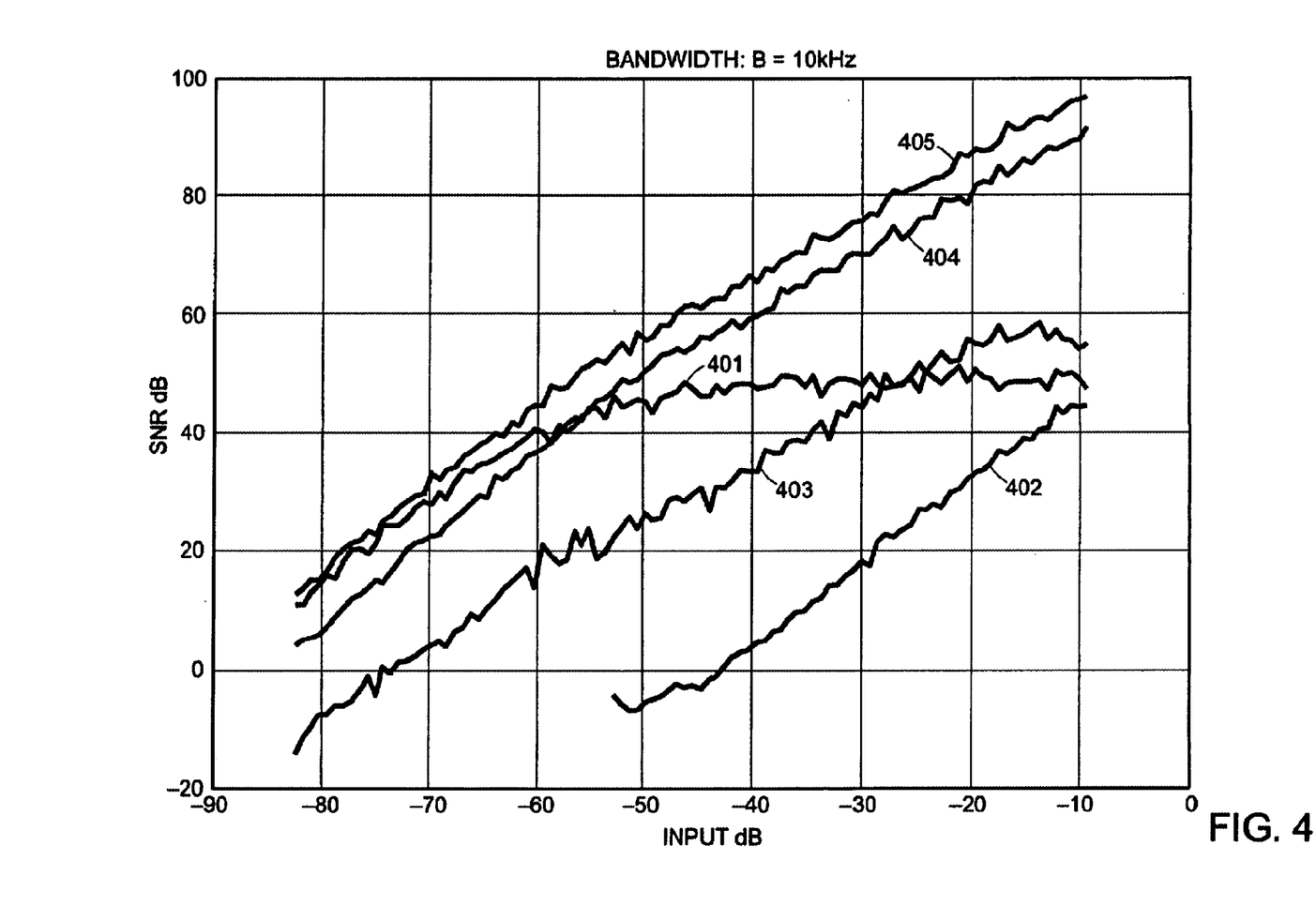
FIG. 4 shows SNR-simulation results representative of various types of analog-to-digital converters.

In FIG. 4, the SNR of various types of analog-to-digital converters are shown as a function of the input signal's power. The input x(n), within the range [−1<x(n)<1] (i.e., a=1), is a periodic zero-mean noise sequence composed of 10000 samples, and the bandwidth is B=10 kHz. Within this bandwidth, amplitudes and phases of the spectral lines are randomized. Different values of signal power are obtained by proportional amplification of this signal. The input power is referenced to the power level of a dc-signal with amplitude a=1. At the maximum input power level shown in FIG. 4 (i.e., at −9.45 dB), the maximum signal amplitude reaches 0.99, which is just below the limit of the reference level a=1. The sampling rate for all systems is $$\frac{1}{T} = 1 \text{ MHz},$$

and the SNRs are computed within B=10 kHz.

Curve 401 depicts the SNR of an ideal adaptive sigma-delta modulator in accordance with one embodiment of the invention, where the adaptation algorithm of Tab. 1 and a 9-bit DAC is used (a=1). Reducing the input power from the maximum level to lower levels, the SNR tends to remain constant. For input levels smaller than about −50 dB, the SNR is decreasing. Curve 402 is the SNR of an ideal standard sigma-delta modulator of $1^{st}$ order with $y_a(n) \in \pm 1$. The maximum SNR is obtained at the maximum input power level, and a decrease of input power results in a decrease of the SNR. Comparing curves 401 and 402 clearly demonstrates the benefit of the adaptive sigma-delta modulator. Curve 402 is very similar to the segment of curve 401 having input levels smaller than about −50 dB, shifted to the right by about 48 dB. This shift reflects the additional 8 bits of signal z(n) as compared to $y_a(n)$. For input levels smaller than about −50 dB, the adaptive sigma-delta modulator operates in a manner similar to a standard sigma-delta modulator, since the feedback-signal z(n) is a two-level signal, $z(n) \in \pm 1/256$. Note that for high input levels, the SNR of the adaptive modulator is not substantially higher than for the standard modulator. However, the input dynamic range has been expanded by approximately 48 dB. Curve 403 depicts the SNR of a sigma-delta-modulator of $2^{nd}$ order.

Obviously, at lower input levels, the $2^{nd}$ order system is outperformed by the adaptive modulator. Curves 404 and 405 depict the SNR's of Pulse Code Modulation (PCM) systems with 13 and 14 bit resolutions, respectively. Whereas the 14-bit PCM system is superior to the adaptive sigma-delta modulator for all input levels, the 13-bit PCM system is inferior at least at low-level input signals.

In accordance with one embodiment of the invention, the adaptive sigma-delta modulator includes a multi-bit DAC 204 in the feedback loop, as shown in FIG. 2, since the feedback signal z(n) is a multi-level signal. In preferred embodiments of the invention, the specifications of this DAC 204 is chosen to have minimal effects on the SNR of the adaptive sigma-delta modulator. The non-ideal DAC can be regarded as an ideal converter plus a noise source, with the transfer function of this additional noise source being $-NTF(z)=-z^{-1}$. Thus, this noise (multiplied by $-1$) is directly added to the input signal and enhances the noise energy in the base band. For the DAC 204, the following assumptions can be made:

(1) The distribution of DAC-errors is symmetric around zero.
(2) Each discrete DAC-levels is implemented by means of superposition of binary weights.
(3) Each binary weight itself is composed of elementary unit components. This implies, e.g., that for a particular binary weight which is composed of K unit components, the nominal value is increasing proportional to K, whereas the error is increasing proportional only to $\sqrt{K}$.

For example, for a 9-bit DAC, the pattern $c_0(n)=[1\ 0\ 0\ 1\ 0\ 1\ 0\ 1]$ contains the binary weights 128, 16, 4, and 1, and hence the nominal magnitude of the resulting DAC-level is $$\frac{149}{255}a.$$

However, the single weights can only be realized as $$128\left(1\pm\frac{\Delta}{\sqrt{128}}\right),\ 16\left(1\pm\frac{\Delta}{\sqrt{16}}\right),\ 4\left(1\pm\frac{\Delta}{\sqrt{4}}\right),$$

and $(1\pm\Delta)$, which results in a deviation from the nominal value.

Figure 5:
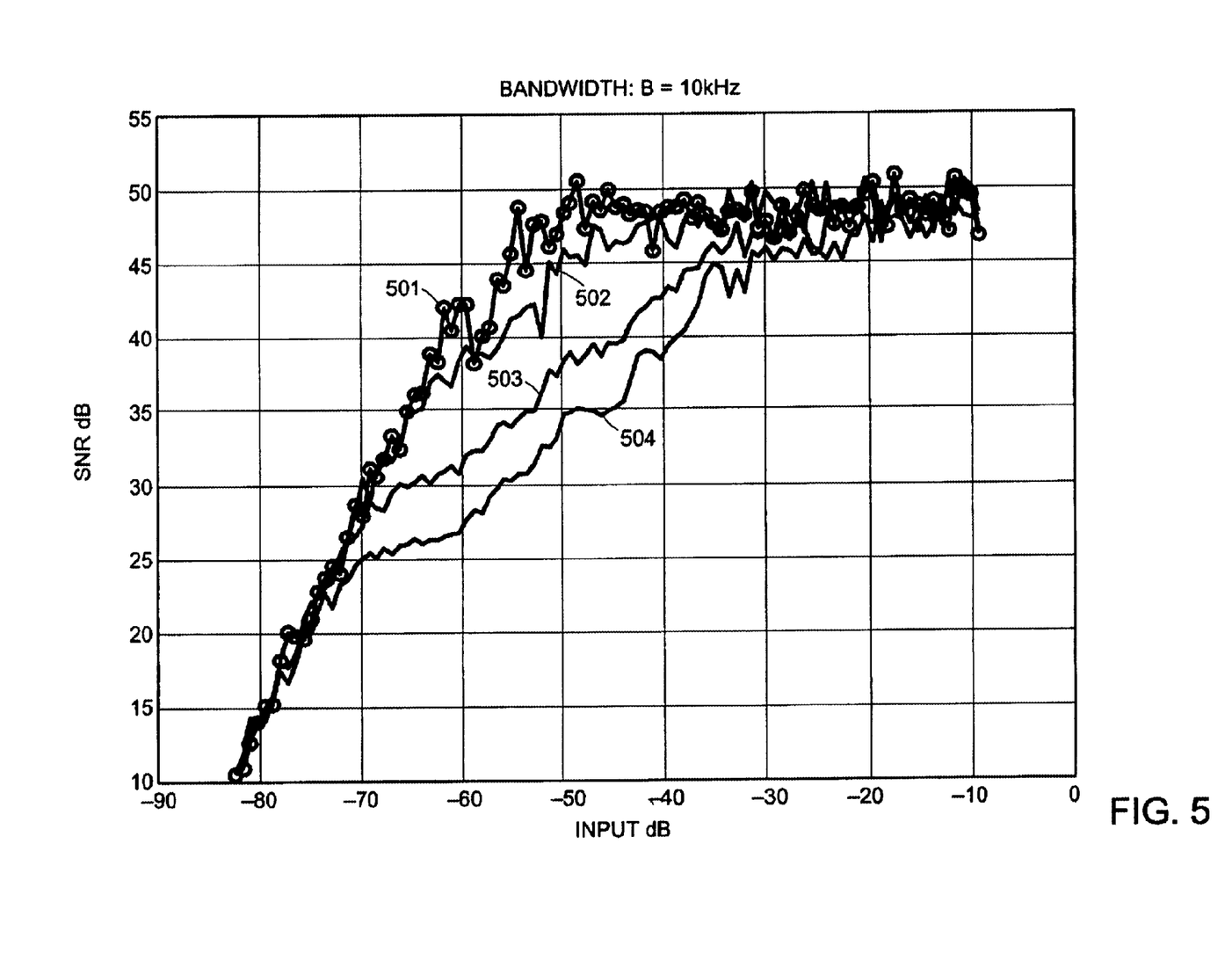
FIG. 5 shows SNR-simulation results representative for adaptive sigma-delta ($\Sigma$-$\Delta$) modulators with ideal and non-ideal digital-to-analog converters in accordance with one embodiment of the invention.

FIG. 5 shows the SNRs of an adaptive sigma-delta modulator with an ideal 9-bit DAC ($\Delta=0$) 501, and non-ideal DACs for $\Delta=1\%$ 502, $\Delta=3\%$ 503, and $\Delta=5\%$ 504, where $\Delta$ denotes the maximum deviation of the implemented level number K=1 from the nominal value. In all cases, the contribution of the dc-offset error is omitted, and the input signal is the same as for FIG. 4 (N=10000). FIG. 5 shows that the SNR reduction will be within acceptable limits with parameters $\Delta$ better than about $\Delta\approx1\%$.

The adaptive sigma-delta modulator shown in FIG. 2 yields its optimum performance if the input x(n) is a zero-mean signal, or if the dc-component of x(n) is at least close to zero. However, if x(n) contains a considerable dc-component, the input dynamic range is reduced. Consider, for example, an input signal with a dc-component and comparatively very small ac-component. The step size reduction will be governed by the dc-component and not the ac-component, and thus it remains too large. Dc-components can be introduced from either the input signal directly, or by offset-errors due to non-ideal components of the modulator itself. In practical implementations, offset errors in the DAC might occur. In any case, a high-pass filter removes most problems involved with dc- or very low frequency components.

Figure 6:
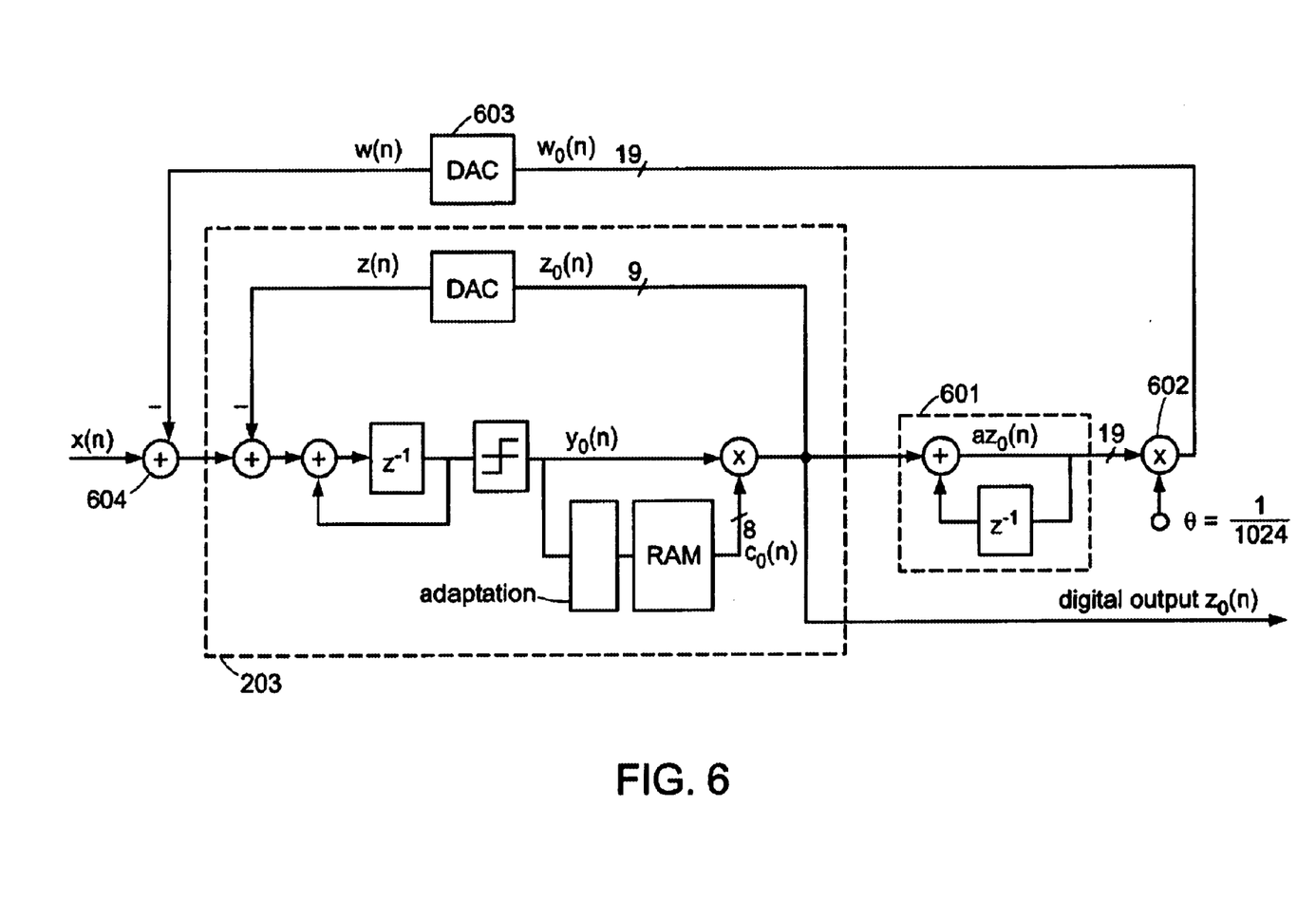
FIG. 6 is a block diagram of an adaptive sigma-delta ($\Sigma$-$\Delta$) modulator with one bit quantization that includes a high pass filter stage in accordance with one embodiment of the invention.

In accordance with one embodiment of the invention, an implementation of a high-pass filter is implemented as shown in FIG. 6. Here, the adaptive sigma-delta modulator 203 of FIG. 2 is embedded in a feedback loop system, which represents a typical digital high-pass filter. The digital output $z_0(n)$ of the modulator is first accumulated 601, resulting in signal $az_0(n)$, and then multiplied 602 by a factor $\theta$, resulting in signal $w_0(n)$. Digital-to-analog conversion of $w_0(n)$ by means of a second DAC 603 results in signal w(n), which is subtracted 604 from the input x(n). The overall signal-transfer-function $STF_{HP}(z)$ of such a system is given by $$STF_{HP}(z)=STF(z)HP(z), \quad (3)$$

with the standard $\Sigma$-$\Delta$ signal-transfer-function, i.e., STF(z)= $z^{-1}$, and the high-pass transfer-function $$HP(z)=\frac{1-z^{-1}}{1-(1-\theta)z^{-1}}.$$

There is a zero at z=1 corresponding to a frequency f=0, and a pole at z=1-$\theta$. Using, for example, a sigma-delta rate of 1 MHz and $$\theta=\frac{1}{1024}$$

results in a 3-dB cut off frequency of about 150 Hz.

Figure 7:
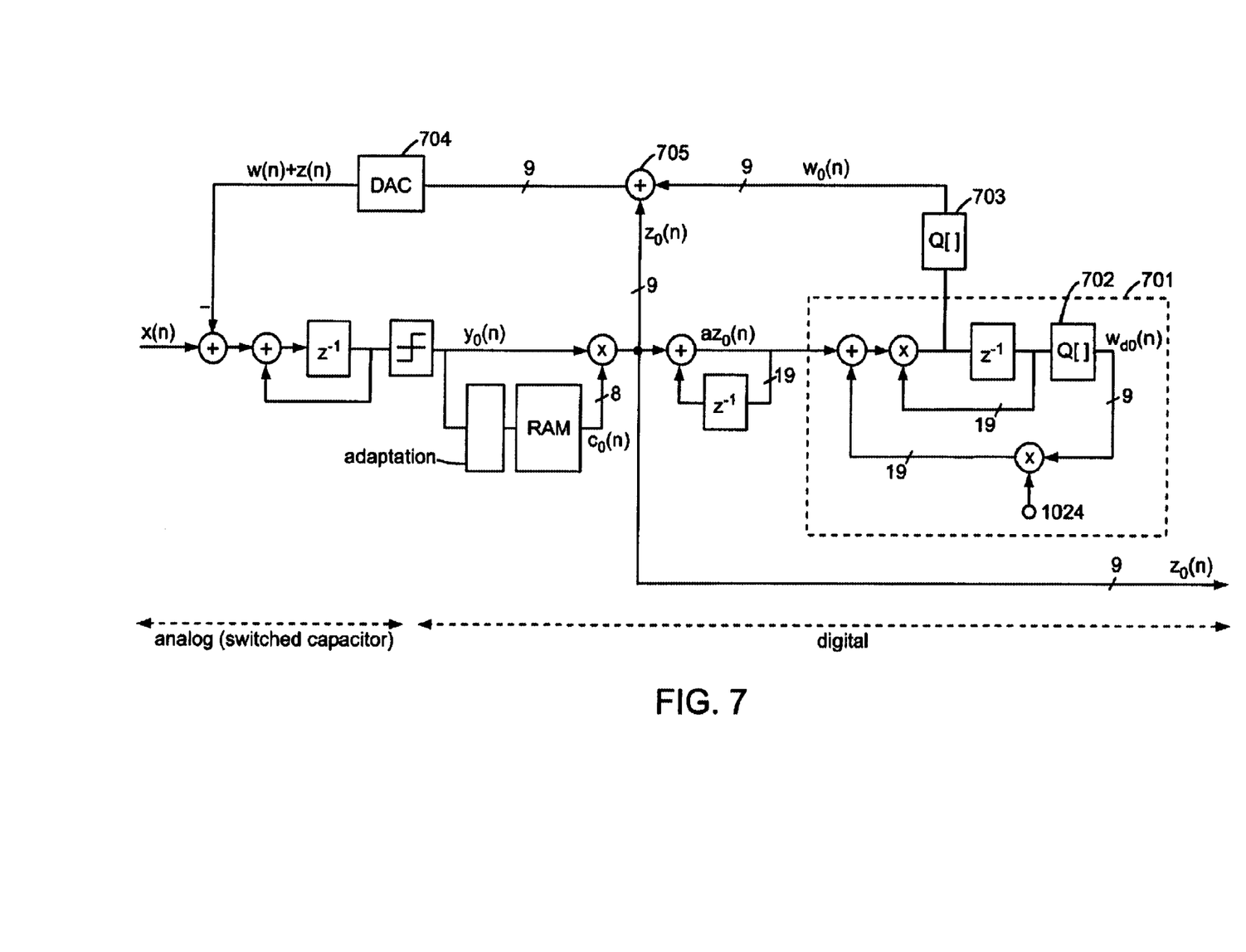
FIG. 7 is a block diagram of an adaptive sigma-delta ($\Sigma$-$\Delta$) modulator with one bit quantization having a high pass filter stage that includes a numeric multibit sigma-delta modulator in accordance with one embodiment of the invention.

The system shown in FIG. 6 is not well suited for practical implementation, since a 19-bit DAC is involved. Therefore, in accordance with various embodiments of the invention, means to circumvent such a high precision DAC are implemented. In accordance with one embodiment of the invention, inserting a numeric version of a multibit sigma-delta modulator 701 into the system results, for example, in the system as shown in FIG. 7. Assuming $$\theta=\frac{1}{1024},$$

signal $az_0(n)$ comprises 19 bits. Following the general rules of sigma-delta modulation, this signal is converted to output signal $1024w_{d0}(n)$, which represents the input signal $az_0(n)$, delayed by one clock period. In the present application, signal $w_0(n)=w_{d0}(n+1)$ is used as a high-pass filter feedback signal, which represents the non-delayed input $az_0(n)$, multiplied by 1/1024. In the present embodiment, two identical 9-bit numeric quantizers 702 and 703 with a transfer characteristics of mid-tread-type are employed. Possible output numbers are $-255, -254, \ldots, -2, -1, 0, 1, 2, \ldots 254, 255$. Note that using the numeric multibit sigma-delta modulator provides a very efficient method to implement the constant-factor multiplication 1/1024.

Signal $w_0(n)$ is the sigma-delta version of signal $$\frac{az_0(n)}{1024}.$$

Figure 8:
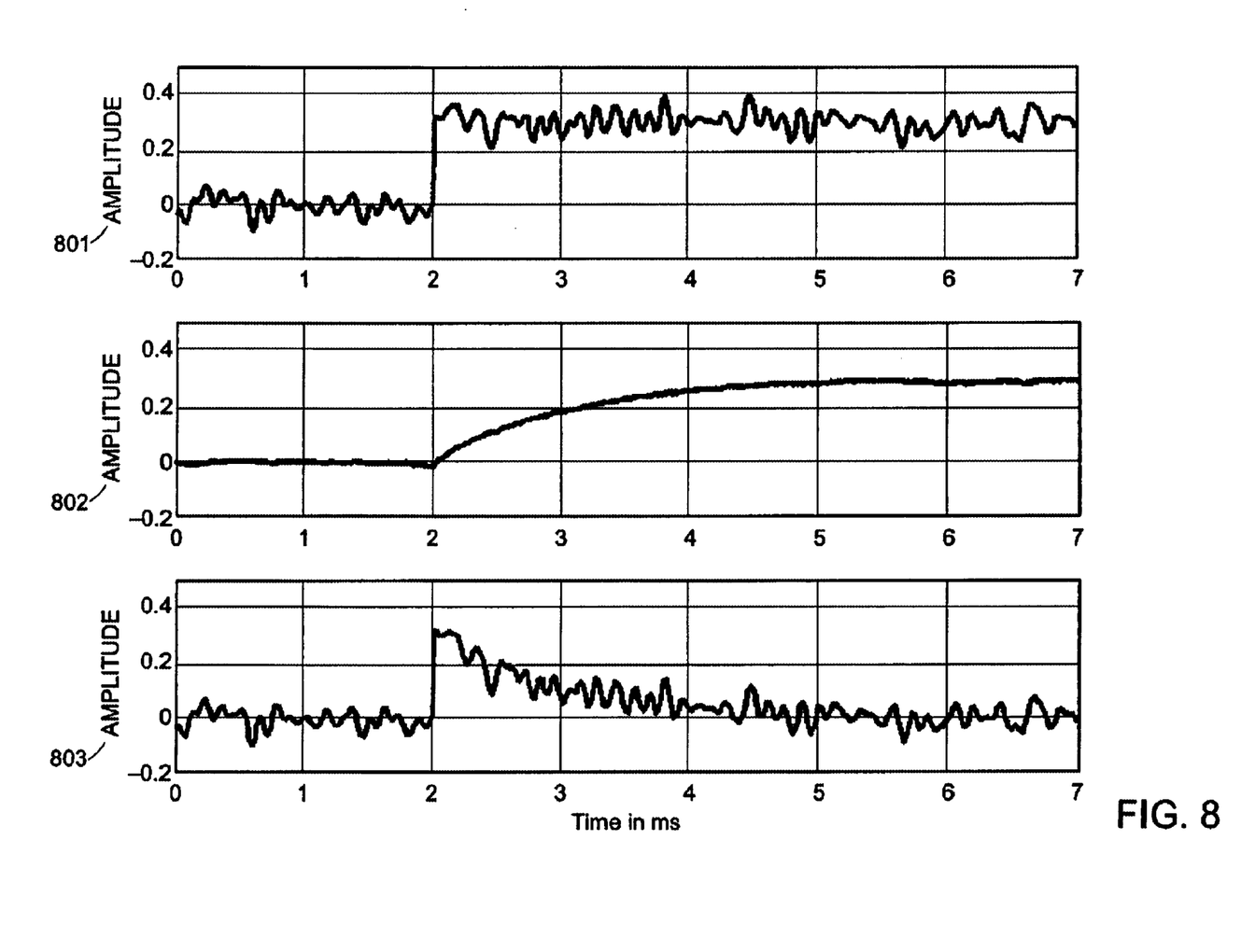
FIG. 8 shows representative waveforms for the system depicted in FIG. 7.

Thus, the number of bits has been reduced from 19 in signal $az_0(n)$ to 9 in signal $w_0(n)$. However, following the principles of multibit sigma-delta modulation, although there is a difference of 10 bits both signals contain almost the same information. Information contained in the 10 bit difference is preserved in the temporal fine structure of $w_0(n)$. Additionally, in this example, since both signals $z_0(n)$ and $w_0(n)$ are composed of 9 bits, the 2 DACs of FIG. 6 can be replaced by a single DAC 704, controlled by the sum 705 of signals $z_0(n)$ and $w_0(n)$. FIG. 8 depicts typical waveforms of the system in FIG. 7. The first trace 801 shows an input signal $x(n)$ with a step-like transition after 2 ms. The second trace 802 depicts the resulting 9-bit signal $w(n)$, which shows the typical low-pass character. With a cut off frequency of about 150 Hz, the time is about $$\tau = \frac{1}{2\pi 150} s \approx 1 \text{ ms.}$$

As stated above, information is contained in the temporal fine structure of the signal. The third trace 803 shows the difference signal $x(n)-w(n)$, which represents the high-pass filtered version of $x(n)$.

Figure 9:
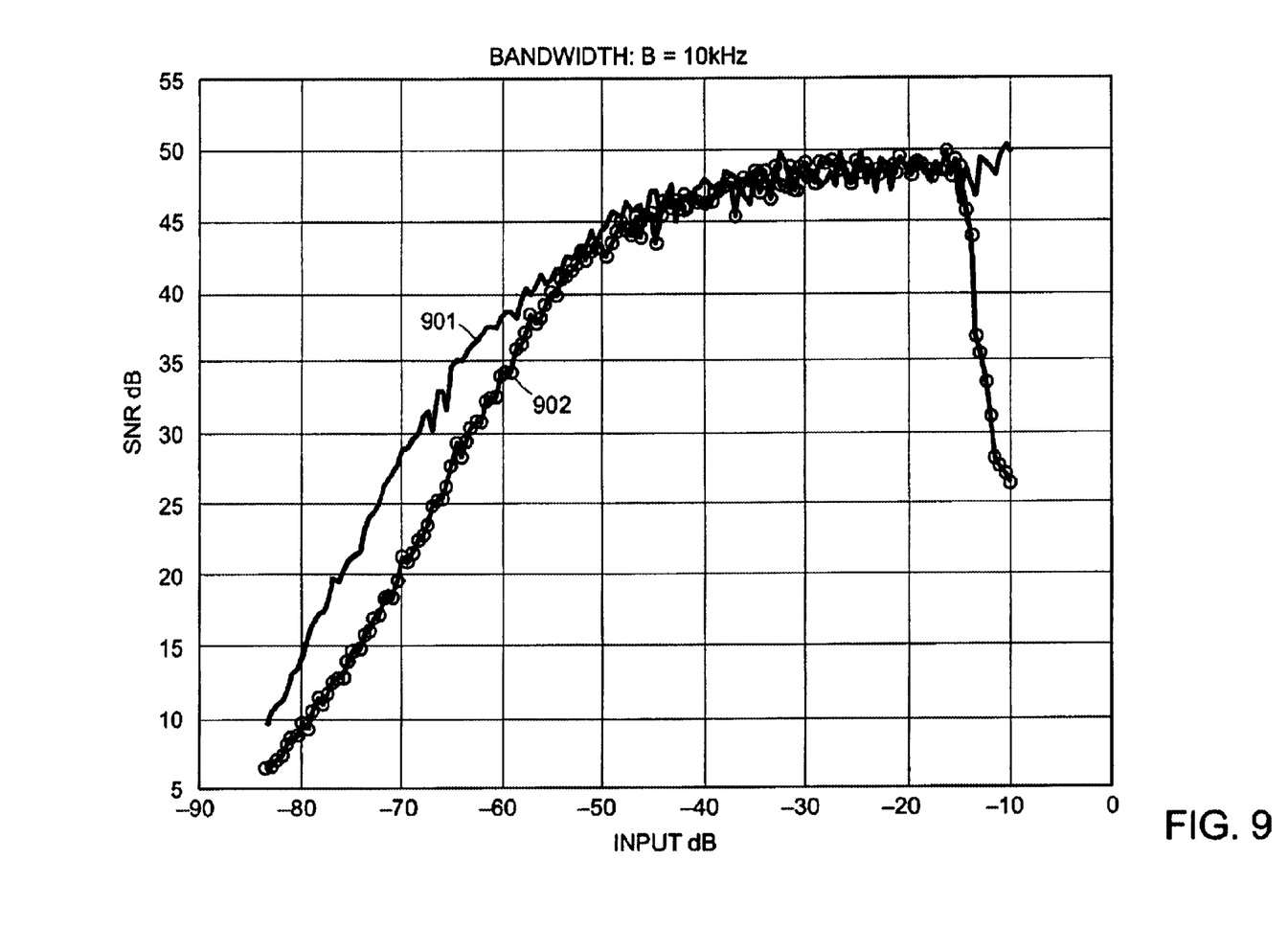
FIG. 9 shows SNR-simulation results pertaining to the signal-to-noise ratio for the system depicted in FIG. 7.

In FIG. 9, the SNR obtained with the system depicted in FIG. 7, using an ideal high-pass filter, is compared with the SNR obtained with the system depicted in FIG. 8, which uses a high-pass filter with numeric multibit sigma-delta modulator (employing 9-bit quantizers of mid-tread type), as waveforms 901 and 902, respectively. The same input signal as specified in FIGS. 4 and 5, with N=20000, is used. For both systems, the noise power in the signal band is derived from the difference between the system output signal and a reference signal. The reference signal is the high-pass filtered version of $x(n)$, assuming the ideal transfer function (3). The additional noise introduced by the numeric multibit sigma-delta modulator results in a loss of SNR at low input power levels. The input dynamic range is reduced by approximately 6 dB. The decrease of SNR at high input levels is due to a clipping effect and appears, if the sum $w_0(n)+z_0(n)$ exceeds the range [−255, 255]. The two SNR-curves 901, 902 are obtained assuming DAC's with $\Delta=1\%$.

Alternative embodiments of the invention may be implemented as a computer program product for use with a computer system. Such implementation may include a series of computer instructions fixed either on a tangible medium, such as a computer readable media (e.g., a diskette, CD-ROM, ROM, or fixed disk), or fixed in a computer data signal embodied in a carrier wave that is transmittable to a computer system via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web).

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. An adaptive sigma delta modulator comprising:
   a) a first input stage that produces a difference signal representing the difference between an analog input signal $x(n)$ and a first analog feedback signal $z(n)$, the amplitude of the analog input signal $x(n)$ within a first range [−a, +a];
   b) a first accumulator stage that produces a first accumulated signal representing an accumulation of the difference signal;
   c) a first quantization stage that produces a first quantized digital signal $y_0(n)$ representing the first accumulated signal;
   d) a first adaptation stage, that based on the first quantized digital signal $y_0(n)$ produces a first digital output signal $z_0(n)$; and
   e) a first digital-to-analog converter stage that converts the first digital output signal $z_0(n)$ to the first analog feedback signal $z(n)$;
   wherein the first adaptation stage tends to keep the instantaneous magnitude of the first analog feedback signal $z(n)$ within the first range [−a, +a] and greater than the analog input signal's $x(n)$ instantaneous magnitude.

2. An adaptive sigma delta modulator according to claim 1, wherein the first quantized digital signal $y_0(n)$ includes a two-level digital output sequence.

3. An adaptive sigma delta modulator according to claim 2, wherein the two-level digital output sequence includes values of +1 and −1.

4. An adaptive sigma delta modulator according to claim 1, wherein the first adaptation stage includes a first multiplier stage that multiplies the first quantized digital signal $y_0(n)$ by a step size $c_0(n)$.

5. An adaptive sigma delta modulator according to claim 4, wherein the step size $c_0(n)$ is based on a set Y of code words, where $Y=\{y_0(n), y_0(n-1), y_0(n-2) \ldots y_0(n-x)\}$, x being a predetermined integer.

6. An adaptive sigma delta modulator according to claim 5, wherein the step size $c_0(n)$ is increased if a majority of the code words are equal.

7. An adaptive sigma delta modulator according to claim 5, wherein the step size $c_0(n)$ is decreased if the code words alternate.

8. An adaptive sigma delta modulator according to claim 5, wherein the step size $c_0(n)$ is non-linear.

9. An adaptive sigma delta modulator according to claim 4, wherein the first multiplier stage includes a look-up-table RAM for computing multiplication of the first quantized digital signal $y_0(n)$ and the step size $c_0(n)$.

10. An adaptive sigma delta modulator according to claim 1, further comprising a high pass filter stage for filtering the analog input signal $x(n)$ prior to the first input stage.

11. An adaptive sigma delta modulator according to claim 1, further comprising a feedback loop stage based on the digital output signal $z_0(n)$ for subtraction from the analog input signal $x(n)$ prior to the first input stage, such that the feedback loop stage acts as a high pass filter on the analog input signal $x(n)$.

12. An adaptive sigma delta modulator according to claim 1, further comprising a high pass filter stage, the high pass filter stage including:
   a) a second accumulator stage that produces a second accumulated signal $az_0(n)$ representing the accumulation of the first digital output signal $z_0(n)$;

b) a multiplication stage that produces a multiplied signal $w_0(n)$ representing the second accumulated signal $az_0(n)$ multiplied by a factor $\theta$;

c) a second analog-to-digital converter for converting the multiplied signal $w_0(n)$ to a second analog feedback signal $w(n)$;

d) a pre-input stage for subtracting from an analog pre-input signal $x_p(n)$ the second analog feedback signal $w(n)$ to create the analog input signal $x(n)$.

13. An adaptive sigma delta modulator according to claim 1, further comprising:

a) a second accumulator stage that produces a second accumulated signal $az_0(n)$ representing an accumulation of the first digital output signal $z_0(n)$;

b) an embedded sigma delta modulator that produces a digital signal $w_0(n)$ representing the accumulated signal $az_0(n)$ multiplied by a factor $\theta$ such that the digital signal $w_0(n)$ includes low frequency components of the analog input signal $x(n)$; and c) a second summing stage that adds the digital signal $w_0(n)$ to the first digital output signal $z_0(n)$ prior to the first digital-to-analog converter stage, whereby the analog input signal $x(n)$ is high pass filtered.

14. An adaptive sigma delta modulator according to claim 13, wherein the digital signal $w_0(n)$ is represented by a smaller number of bits as compared to the accumulated signal $az_0(n)$.

15. A method for adapting sigma delta modulation, the method comprising:

a) producing a difference signal representing the difference between an analog input signal $x(n)$ and a first adaptive feedback signal $z(n)$, the amplitude of the analog input $x(n)$ within a first range $[-a, +a]$;

b) producing a first accumulated signal representing an accumulation of the difference signal;

c) producing a first quantized digital signal $y_0(n)$ representing a quantization of the first accumulated signal;

d) producing a first digital output signal $z_0(n)$ based on the first quantized digital signal $y_0(n)$, such that the instantaneous magnitude of the first analog feedback signal $z(n)$ is substantially kept within the first range $[-a, +a]$ and greater than the analog input signal's $x(n)$ instantaneous magnitude; and e) performing a digital-to-analog conversion on the first digital output signal $z_0(n)$ to produce the first adaptive feedback signal $z(n)$.

16. A method according to claim 15, wherein producing the first quantized digital signal $y_0(n)$ includes producing a two-level digital output sequence.

17. A method according to claim 15, wherein producing the first quantized digital signal $y_0(n)$ includes producing a two-level digital output that includes values of +1 and −1.

18. A method according to claim 15, wherein producing the first digital output signal $z_0(n)$ includes multiplying the first quantized digital signal $y_0(n)$ by a step size $c_0(n)$.

19. A method according to claim 18, further comprising determining the step size $c_0(n)$ based on a set Y of code words, where $Y=\{y_0(n), y_0(n-1), y_0(n-2) \ldots y_0(n-x)\}$, x being a predetermined integer.

20. A method according to claim 19, wherein determining the step size $c_0(n)$ includes increasing the step size $c_0(n)$ if a majority of the code words are equal.

21. A method according to claim 19, wherein determining the step size $c_0(n)$ includes to decreasing the step size $c_0(n)$ if the code words alternate.

22. A method according to claim 19, wherein the step size $c_0(n)$ is non-linear.

23. A method according to claim 19, wherein multiplying includes using a look-up-table RAM for computing multiplication of the first quantized digital signal $y_0(n)$ and the step size $c_0(n)$.

24. A method according to claim 15, further comprising high pass filtering the analog input signal $x(n)$.

25. A method according to claim 24, wherein high pass filtering the analog input signal $x(n)$ includes subtracting from the analog input signal $x(n)$ a feedback signal based on the digital output signal $z_0(n)$.

26. A method according to claim 24, wherein high pass filtering the analog input signal $x(n)$ includes:

a) producing a second accumulated signal $az_0(n)$ representing the accumulation of the first digital output signal $z_0(n)$;

b) producing a multiplied signal $w_0(n)$ representing the multiplication of the second accumulated signal $az_0(n)$ by a factor $\theta$;

c) performing a digital-to-analog conversion on the multiplied signal $w_0(n)$ to produce a second analog feedback signal $w(n)$; and d) producing the analog input signal $x(n)$ by subtracting from an analog pre-input signal $x_p(n)$ the second analog feedback signal $w(n)$.

27. A method according to claim 24, wherein high pass filtering the analog input signal $x(n)$ includes:

a) producing a second accumulated signal $az_0(n)$ representing the accumulation of the first digital output signal $z_0(n)$;

b) producing a digital signal $w_0(n)$ using an embedded sigma delta modulator, the digital signal $w_0(n)$ representing the accumulated signal $az_0(n)$ multiplied by a factor $\theta$ such that the digital signal $w_0(n)$ includes low frequency components of the analog input signal $x(n)$; and c) adding the digital signal $w_0(n)$ to the first digital output signal $z_0(n)$.

28. A method according to claim 27, wherein producing the digital signal $w_0(n)$ the digital signal $w_0(n)$ is represented by a smaller number of bits as compared to the accumulated signal $az_0(n)$.

* * * * *